United States Patent
Lebel et al.

(10) Patent No.: US 6,579,149 B2
(45) Date of Patent: Jun. 17, 2003

(54) SUPPORT AND ALIGNMENT DEVICE FOR ENABLING CHEMICAL MECHANICAL POLISHING RINSE AND FILM MEASUREMENTS

(75) Inventors: Richard J. Lebel, Williston, VT (US); Frederic Maurer, Valhalla, NY (US); Rock Nadeau, Chittenden, VT (US); Paul H. Smith, Jr., Chittenden, VT (US); Hemantha K. Wickramasinghe, Chappaqua, NY (US); Theodore G. van Kessel, Millbrook, NY (US)

(73) Assignee: International Business Machines Corporation, Armonk, NY (US)

( * ) Notice: Subject to any disclaimer, the term of this patent is extended or adjusted under 35 U.S.C. 154(b) by 178 days.

(21) Appl. No.: 09/777,548

(22) Filed: Feb. 6, 2001

(65) Prior Publication Data

US 2002/0106972 A1 Aug. 8, 2002

(51) Int. Cl.⁷ .......................... B24B 49/00; B24B 51/00
(52) U.S. Cl. ................................ 451/6; 451/8; 451/67
(58) Field of Search ....................... 216/88, 89; 438/692, 438/693; 451/5, 6, 8, 41, 54, 65, 67, 285, 288, 289, 290, 444; 356/318, 326; 134/37, 56 R, 94.1, 99.1, 103.2

(56) References Cited

U.S. PATENT DOCUMENTS

| | | | |
|---|---|---|---|
| 4,998,021 A | 3/1991 | Mimasaka |
| 5,081,796 A | 1/1992 | Schultz |
| 5,220,405 A | 6/1993 | Barbee et al. |
| 34,425 A | 11/1993 | Schultz |
| 5,433,650 A | 7/1995 | Winebarger |
| 5,461,007 A | 10/1995 | Kobayashi |
| 5,492,594 A | 2/1996 | Burke et al. |
| 5,640,242 A | 6/1997 | O'Boyle et al. |
| 5,777,739 A | 7/1998 | Sandhu et al. |
| 5,856,871 A | 1/1999 | Cabib et al. |
| 5,872,633 A | 2/1999 | Holzapfel et al. |
| 5,936,733 A | 8/1999 | Sandhu et al. |
| 5,948,203 A | 9/1999 | Wang |
| 5,949,927 A | 9/1999 | Tang |
| 5,958,148 A | 9/1999 | Holzapfel et al. |
| 5,961,369 A | 10/1999 | Bartels et al. |
| 5,999,264 A | 12/1999 | Handa |
| 6,020,264 A | 2/2000 | Lustig et al. |
| 6,319,093 B1 * | 11/2001 | Lebel et al. ............... 451/6 |
| 2002/0052126 A1 * | 5/2002 | Lee et al. ............... 438/784 |

FOREIGN PATENT DOCUMENTS

WO        WO 95/18353        7/1995

OTHER PUBLICATIONS

Herbert E. Litvak, et al., "Implementing Real–Time Endpoint Control in CMP", *Semiconductor International*, Jul. 1996, pp. 259–264.

* cited by examiner

*Primary Examiner*—Timothy V. Eley
(74) *Attorney, Agent, or Firm*—McGinn & Gibb, PLLC; Robert A. Walsh, Esq.

(57) ABSTRACT

A device and method for providing precision alignment and support for an optical film measurement probe in the wafer rinse tank of a CMP polish tool. The device includes of a probe carrier, and spring loaded support guides attached to a support ring that supports and locates the mechanism in the rinse tank of the CMP tool. The probe carrier has multiple beveled bearing pads (three or more) that contact the rim of the rotating wafer chuck. Pressure from the chuck against these pads forces the probe carrier to maintain a fixed distance and orientation relative to the wafer while allowing the smooth rotation and motion of the wafer and chuck. Further, an integrated the wafer spray nozzles can be attached to the probe carrier that is located so as to minimize interference between wafer spraying and the probe carrier.

20 Claims, 3 Drawing Sheets

SUPPORT AND ALIGNMENT DEVICE FOR ENABLING CHEMICAL MECHANICAL POLISHING RINSE AND FILM MEASUREMENTS

BACKGROUND OF THE INVENTION

1. Field of the Invention

This invention relates generally to chemical mechanical planarization or polishing (CMP) tools and, more particularly, to a device for supporting and maintaining proper alignment of a probe for measuring film thickness during a chemical-mechanical rinse phase of wafer processing.

2. Description of the Related Art

Briefly, the chemical mechanical polishing process requires that a workpiece be held, with the desired coated surface face down, on a polishing pad supported on a rotating table, in the presence of an abrasive slurry. A chemical mechanical polishing machine can include a single rotating polishing plate and a smaller diameter rotating wafer carrier to which a wafer (or wafers) is (are) mounted. The wafer carrier is held above the polishing plate, in either a stationary fixed position or oscillating back and forth in a predetermined path, while both polishing plate and wafer carrier are rotated about their respective center axes. A slurry, consisting of an abrasive suspension with or without an etching reagent, is fed onto the polishing plate during polishing of the wafer. The slurry, also referred to as a carrier liquid, can be selected to include an etchant for the coating being planarized and for not substantially attacking other materials involved in the process. The slurry is further fed between the polishing plates to polish and flush away the material removed from the semiconductor wafer. Current chemical mechanical polish CMP tools are built with a constrained processing sequence whereby wafers are loaded from a cassette, polished, rinsed, cleaned, dried and unloaded. In some cases there are multiple polish steps where a wafer is polished first in one polishing medium, rinsed, polished in a second medium, rinsed, cleaned, dried and unloaded.

Further, when a CMP process polishes transparent materials such as oxides and nitrides in addition to metals, the process is typically controlled by using these same optical film thickness measurement. For example, back end silicon dioxide layers are typically polished from a starting thickness of 20000 angstroms to a final thickness of 10000 angstroms. To control the process, wafers have to be removed periodically from the spin dryer and measured on an optical film thickness measurement tool that examines the film reflectivity spectrum across a range of optical wavelengths to determine the thickness of material from the optical fringe pattern. Thickness measurements are typically made at many points on the wafer (usually six or more). The deviation of this thickness value from a desired value is used to adjust the polish time for subsequent wafers up or down to assure that they are polished to the correct thickness.

The measurement of thin films on semiconductor and other micro-manufactured parts is typically performed by an optical interference technique in which the reflectance or transmission properties are measured using an optical probe using a separate apparatus. Then, the acquired spectrum is analyzed with a computer program using known film properties and physics to solve for unknown properties such as film thickness, density etc. For ideal films having one or more perfectly flat layers, these measurements are straight forward and well documented.

In particular, when using these various CMP polishing tools in processing a wafer where a sufficient amount of surface films has been polished (removed by grinding), the wafer is rinsed and cleaned to remove slurry and then dried in a spin-dry process in separate processing stages using a particular tool. This is time consuming and introduces error into the processing of wafers. Indeed, prior to the invention, no effective device has existed that can properly support a film thickness measurement probe in a rinse tank of a CMP polishing tool, thereby allowing this critical process control information to be acquired immediately and simultaneously after the wafer leaves the polishing section of the CMP tool to be rinsed.

SUMMARY OF THE INVENTION

In view of the foregoing and other problems, disadvantages, and drawbacks of CMP polishing tools, it is a principal object of the present invention to provide a precision alignment and support structural assembly for an optical film measurement probe in the wafer rinse tank of a CMP polish tool.

It is therefore another object of the invention to provide a support and alignment device that saves significant process time and improves CMP process control loop effectiveness.

The invention provides a support and alignment device within a rinse tank of the chemical-mechanical polishing (CMP) tool, wherein the device includes a probe carrier member that is mechanically coupled to a support ring using a retaining assembly comprised of springs and sliding couplings, said retaining assembly allowing motion of said probe carrier member and also bias said probe carrier against a carrier chuck member for holding and positioning a workpiece, bearings that maintains relative positioning of said probe carrier with said carrier chuck member; and a void within said probe carrier member configured for accepting a film measurement probe. The device can further include a water spray nozzle that is attached to said probe carrier.

Moreover, the device can be incorporated with a preferred apparatus for cleaning and providing surface measurements of the workpiece, wherein the apparatus includes a chemical mechanical polishing (CMP) rinse tank having a film measurement probe attached to a carrier probe member retained is said tank, said probe is for determining surface condition of said work piece; and a process controller for providing film thickness measurement of said workpiece. The process controller includes a spectrometer; and said at least one measurement probe comprises at least one multipass optical probe operatively coupled to said spectrometer, wherein each said multipass optical probe comprising: a light source for emitting a light; a light collector or detector for receiving said light; and a retroreflective element configured such that light propagating, in a first direction, from the probe to a work piece and passing through and reflecting from said work piece, is retro-reflected back in a second direction opposite the first direction so as to pass through and reflect from said work piece a total of at least two times.

Another embodiment of the invention includes a method of integrated rinsing of a workpiece and monitoring of workpiece film thickness measurements using a rinse tank section of a chemical mechanical polishing (CMP) apparatus having a film thickness measurement probe operatively coupled to a processor, wherein the method includes measuring a film thickness of a work piece with said probe during a rinse processing of said work piece in said tank, and determining film thickness of said work piece.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 2:
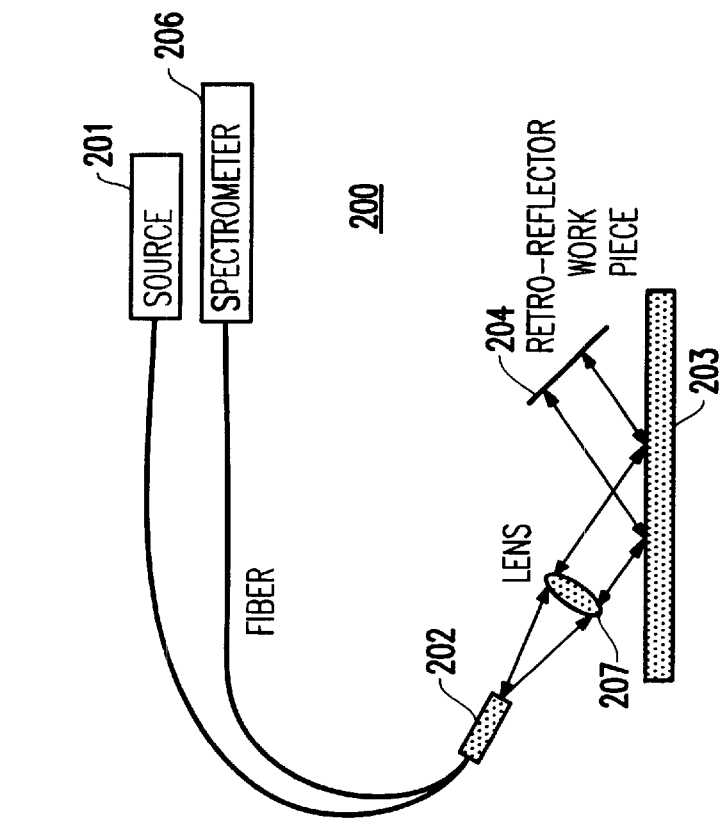
FIG. 2 illustrates a structure 200 according to a second-type of probe used with the device of the invention.

Referring now to the drawings, and more particularly to FIGS. 1-6, there are shown preferred assembly of the support and alignment device with various forms of the probe can take according to the present invention.

Generally, included with the CMP rinse tank support and alignment device of the invention integrates a film thickness measurement probe, wherein the probe can be either an optical probe, an inductive coupling-type probe, or a capacitive coupling-type probe. In preferred form, the probe is an optical interference-type multi-pass optical probe, which is constructed for performing optical thin film thickness and composition measurements during CMP rinsing process. When using optical-type measurement probes, a system that can be used therewith includes an optical light source, a detector, a spectral dispersion and/or filtration elements and optics constructed to propagate light (e.g., broadband light having more than one wavelength) from the probe to the workpiece (wafer) surface films under test, and back to the detector such that a given ray of light passes through the same location on the wafer two or more times always along the same optical path.

Figure 1:
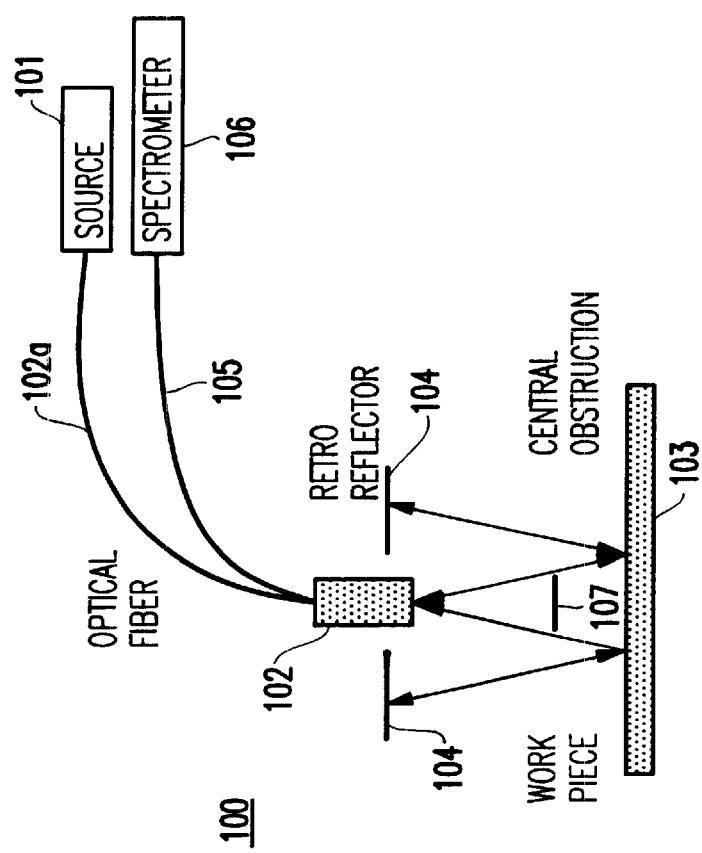
FIG. 1 illustrates a structure 100 according to a first-type of probe that can be used with the device of the invention.
Figure 4:
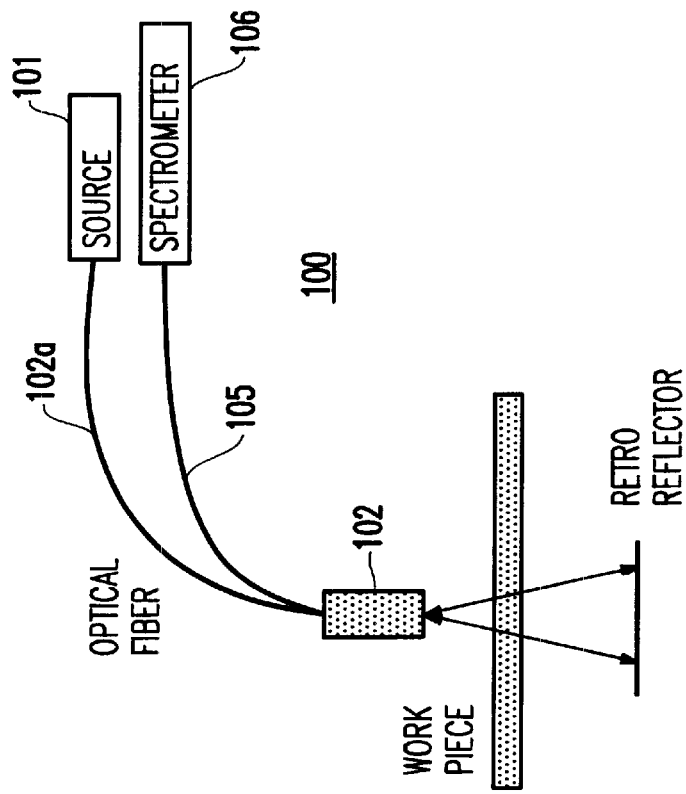
FIG. 4 illustrates a structure 400 according to a fourth first-type of probe used with the device of the invention.
Figure 3:
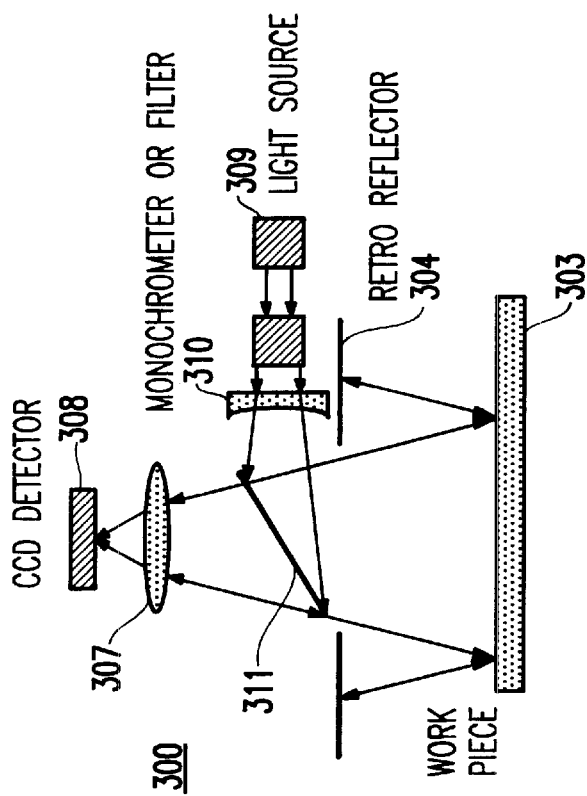
FIG. 3 illustrates a structure 300 according to a third-type of probe used with the device of the invention.

FIGS. 1, 2 and 3 illustrate this concept in three practical, exemplary, non-limiting embodiments for reflective measurements. FIG. 4 illustrates this concept in transmission. These four probe embodiments are disclosed in U.S. patent application Ser. No. 09/635,202, filed Aug. 9, 2000, and entitled "System and Multipass Probe for Optical Interference Measurements," which is hereby incorporated by reference. The optical probe shown in FIG. 1 is the preferred optical probe design that is integrated into the CMP tool assembly 500 shown in FIG. 5 and discussed below.

A key characteristic of each of these embodiments of the probe is the introduction of a retroreflective element positioned and sized to reflect light passing through a specific region of space back along the path it came. A retroreflector is defined as a surface or material which returns incident light in substantially the exact same direction from which it came. It may (or may not) be along the same optical path depending upon the configuration of the retroreflector.

For example, a corner cube will send a light ray back in the opposite direction but the ray will be offset slightly (e.g., very close, but parallel, to the original path). However, retroreflective tape is advantageous in that it sends the light back in the opposite direction and substantially along the same optical path. Thus, the exact retrace of the path will depend upon the type of retroreflective component used.

The multi-pass functionality and spatial filtration are achieved with the introduction of the retroreflective element. In practice, this can be achieved using mirrors, lenses, fibers, etc. Thus, while the inventors have found that the most practical method is to use retroreflective tapes and films, other components may be used including a retroreflective cube such as corner reflectors, quarter cube with mirrors, etc.

The retroreflector in the combination of the probe head design has many properties and derivative qualities which provide unexpectedly superior results. First, the retroreflector is alignment-insensitive. That is, the conventional system may employ a mirror as a conventional reflector. However, a mirror requires exact, precise alignment. The retroreflector in the probe of the present invention does not require such an alignment.

Further, since the light from the retroreflector of the probe goes through the wafer (material) twice, there is an enhanced interference (signal) contrast similar to light going through an optical filter twice.

Finally, the retroreflectors may be used in a confocal geometry such that if light is output from a fiber, then the light (e.g., specular component of the light) will fly right back in from where it came.

The above features provide enormous advantages and allow the probe head design to be used with optical fiber, imaging situations (e.g., see FIG. 3), etc.

FIG. 1 illustrates a first embodiment of the probe head design, and more specifically to a near normal incidence probe 100 that has been used in early process layers of semiconductor parts.

In FIG. 1, light is emitted from a source 101 along a fiber 102a in a cone, reflects off the wafer surface 103 under test, and retro reflects off a retro-reflector 104. The light returns to the fiber bundle 102 along the path it came through the wafer 103. A central obstruction mask 107 is placed to prevent specular (single pass) light from returning to the bundle. The light is measured by a detector 106 (e.g., a spectrometer).

Light that scatters from surface topography is effectively lost from the beam and does not return to the detector fiber 105 and that the light travels through the film stack twice. This effectively makes the probe most sensitive to the planar regions of the wafer 103 where light is specularly reflected. In this case, the range of angles is constrained by the numerical aperture (N.A.) of the fiber, the inner and outer diameter and position of the retroreflector and the central obstruction. By adjusting these variables, precise spatial beam properties can be achieved. It is noted also that even large angle variations of the wafer do not affect the properties of the beam. By rejecting topographic influences, precise positioning of the beam among the work piece is significantly less critical.

FIG. 2 illustrates a collimated beam at a large angle of incidence in a probe 200 according to a second embodiment of the probe, having a source 201, fiber bundle 202, retroreflector 204, fiber 205, and detector 206 similar to those of FIG. 1. An objective lens 207 is provided between the fiber bundle and 202 and the wafer 203 for focusing the output from the wafer.

The probe 200 inherits the property that topography is rejected and improves overall interference signal contrast by constraining the range of angles. This range of angles may be tailored to the application. Small spot or narrow beam profiles can be achieved with this configuration. Both FIGS. 1 and 2 are effectively confocal in that they take light from a small aperture and return it through a small aperture. This also contributes to good interference signal contrast. In both cases, the detector 106, 206 is a spectrometer connected to the probe by a bundle of one or more fibers.

FIG. 3 illustrates the use of the multipass concept in bulk optics (e.g., in an imaging configuration). In this configuration, large areas of a wafer can be examined at high resolution by introducing an array detector (e.g., a charge-coupled device) 308 and an extended source 309. Further included are an objective lens 307, a convex lens 310 and a reflector 311. Because of the properties of the retro reflector 304, this configuration is an effective analog of many FIG. 2 systems in one package. FIG. 4 illustrates the multipass concept in transmission, and specifically the configuration of this particular embodiment is similar to FIG. 1.

Figure 5:
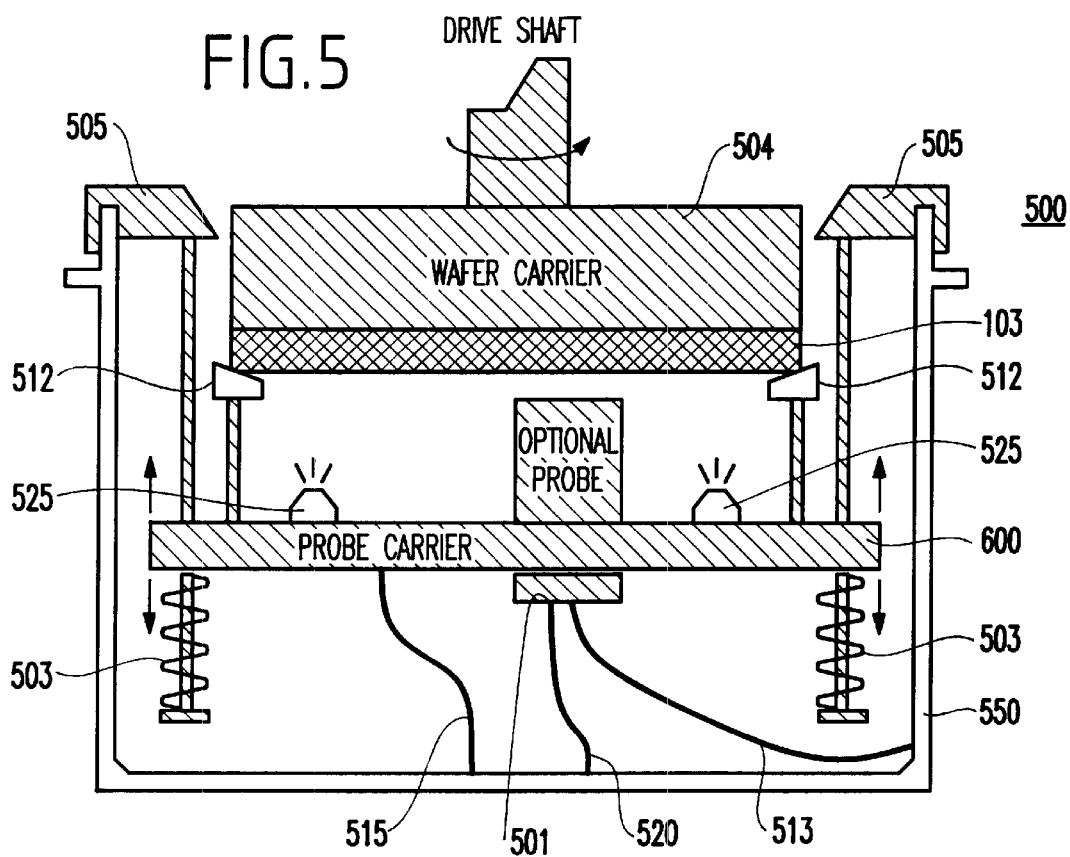
FIG. 5 illustrates in cross-section a rinse tank support and alignment device according to the invention.

FIG. 5 illustrates in cross-sectional view of the rinse tank support and alignment assembly 500 during rinse processing in a rinse tank 550. By using this in-situ integration of the optical thickness measurement with the wafer rinse process, significant processing time is saved which in turn improves CMP process control loop effectiveness because of the elimination of tool infrastructure and handling of wafers being processed.

In FIG. 5, the support and alignment assembly 500 is shown wherein the workpiece (wafer) 103 is supported by a wafer chuck carrier 504. This device includes a probe carrier 600, and spring loaded support guides 503 attached to a support ring 505 that supports and locates the device 500 in a rinse tank 550 of the CMP tool. The probe carrier 600 has multiple beveled bearing pads 512 (three or more) that contact the rim of the rotating wafer chuck 504. Pressure from the chuck against these pads 512 forces the probe carrier 600 to maintain a fixed distance and orientation relative to the wafer 103 while allowing the smooth rotation and motion of the wafer and chuck 504 with small frictional resistance. Additionally, a spray nozzle 525 can be optionally incorporated into the probe carrier 600 to eliminate interference between the probe carrier 600 and spray from the nozzle(s) 525 with water coming through water line 515. The optical fiber 513 that is connected to the optical probe provides optical readings from the optical probe during measurements of film thickness using one of the designs discussed above. An air line 520 can optionally be incorporated in the holder 600 that allows for clearing debris from the optical probe.

Film thickness is preferably measured using optical interference metrology, but can also be done by either inductive or capacitive coupling-type probes when metal coatings are being processed on a wafer. Measuring thickness of these types of films using either a capacitive or inductive probe can be used in place of an optical probe since they have a similar physical aspect as an optical probe. However, measurements by these types of probes are less precise and more alignment sensitive when compared to use of an optical probe.

Using as a preferred an optical-type probe as discussed in the four embodiments above, such a probe with appropriate signal lead(s) 513 (optical or electrical leads) is positioned in direct sight of the surface film and composition properties to be measured where resulting optical reflectance spectra are observed and analyzed to determine the film thickness. Such a probe 501 can operate in either water or air environments.

To operate properly, the probe 501 must be positioned at a given angle and distance from the surface of the workpiece 103 being measured. Performing the film thickness measurement in the rinse area of the CMP tool allows this critical process control information to be acquired immediately after the wafer leaves the polishing area of the tool, which saves significant process time and improves process control loop effectiveness. By supporting the probe 501 in the rinse tank area of a CMP tool, which assures precise positioning of the probe relative to the wafer surface, no actual precision setup alignment in the rinse area itself is required. The assembly 500 is pre-aligned once and then placed in the rinse tank. Once placed, the unit insures the precise position of the probe 501.

Figure 6:
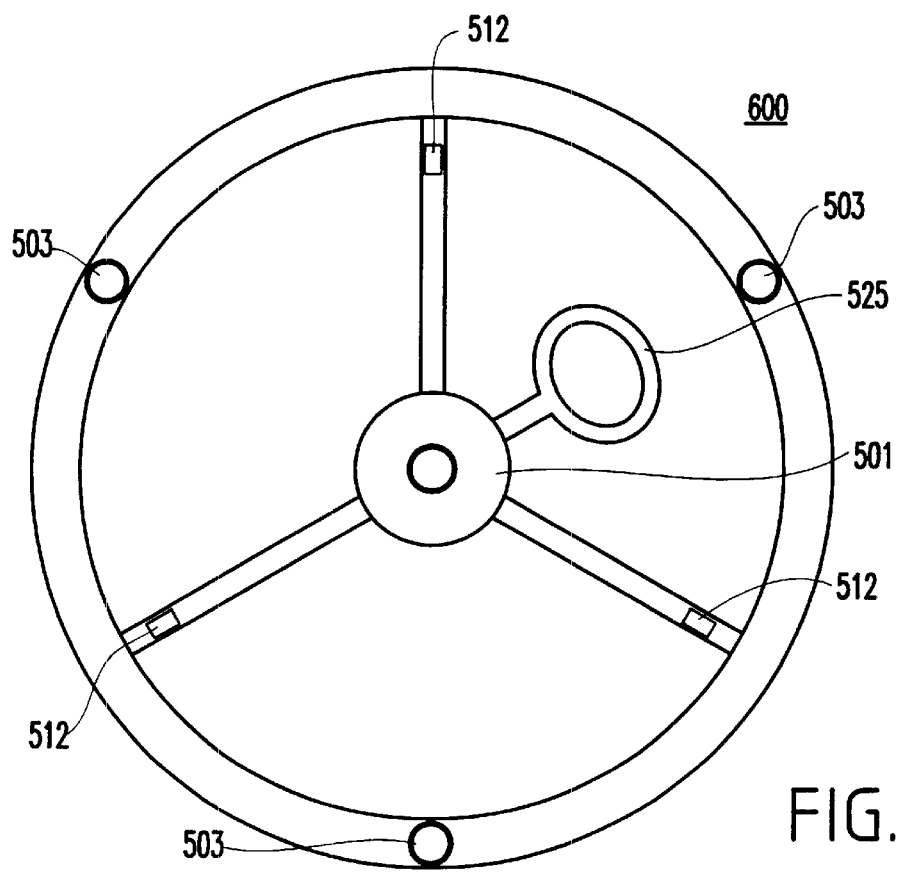
FIG. 6 shows a top view of a probe carrier forming part of the device shown in FIG. 5.

Wafers being processed in a CMP tool are held on the rotating chuck 504 at the end of a robot arm (not shown for clarity) and positioned over the rinse tank 550 in a water spray following the polish operation in a different section of the CMP polishing apparatus. In general, the robot placement is set up with the precision necessary to place the wafer chuck into the rinse tank. This precision is typically on the order of 5-10 millimeters laterally and vertically. While in the tank 550, the wafer chuck 504 is slowly rotated to expose the entire wafer to the water spray. The wafer chuck is imbaled and will often have a slight angular tilt while in the tank resulting in some wobble as it rotates in the rinse tank. FIG. 6 shows a top view of the probe carrier assembly 600.

Use of the invention includes rinsing of a wafer during processing that is typically performed immediately after polishing. By using the invention, the CMP system has immediate feedback of a polish rate to the polishing tool based on observed thickness of wafers coming out of the rinse tank. This rate in turn provides a predetermined polish time. This aspect of the invention results in extremely precise in-situ polishing process control. In addition, by eliminating intermediate measurements during CMP wafer processing, a decrease in overall wafer cycle processing time is achieved on the order of between 25 and 35%.

While the invention has been described in terms of several preferred embodiments, those skilled in the art will recognize that the invention can be practiced with modification within the spirit and scope of the appended claims. For example, it is noted that the invention can be incorporated into a system with a spectrometer. Such a spectrometer can be either an FTIR spectrometer having an interferometer on the back end, or a dispersive-type spectrometer. Moreover, although the preferred use is for semiconductor wafer polishing in a rinse tank, other applications of the invention include measuring of plating in thin film heads (NiFe). Other applications of the invention include use in a rinse area of a stand alone CMP brush-cleaner tool.

While the invention has been described in terms of preferred embodiments, those skilled in the art will recognize that the invention can be practiced with modification within the spirit and scope of the appended claims.

What is claimed is:

1. A chemical-mechanical polishing (CMP) rinse tank comprising:
   a probe carrier;
   a probe mounted on said probe carrier;
   bearing pads connected to said probe carrier;
   a wafer chuck for holding a workpiece and said wafer chuck slidably engaging said bearing pads when the workpiece is flat present; and
   a biasing member adapted to compel said probe carrier toward said wafer chuck
   wherein said bearing pads maintain relative positioning of said probe carrier and said workpiece.

2. The CMP rinse tank in claim 1, further comprising:
   a retaining assembly connected to said probe carrier, said retaining assembly including said biasing member and sliding couplings; and
   a support ring connected to said retaining assembly.
   wherein said probe carrier is mechanically coupled to said retaining assembly, said retaining assembly allowing motion of said probe carrier along said sliding couplings.

3. The CMP rinse tank in claim 1, further comprising a spray nozzle attached to said probe carrier.

4. The CMP rinse tank in claim 3, further comprising a supply hose attached to said probe carrier adapted to supply one of a gas and a liquid to said spray nozzle.

5. The CMP rinse tank in claim 1, further comprising supports rods connected between said probe carrier and said bearing pads.

6. The CMP rinse tank in claim 1, wherein said probe comprises a multipass optical probe comprising:
   a light source for emitting a light;
   a light collector or detector for receiving said light; and
   a retroreflective element.

7. The CMP rinse tank in claim 1, wherein said probe comprises one of an inductive coupling measurement probe and a capacitive coupling measurement probe.

8. A support and alignment device within a rinse tank of a chemical mechanical polishing (CMP) toot the device comprising:
   a support ring;
   a retaining assembly connected to said support ring, said retaining assembly including springs and sliding couplings;
   a probe carrier mechanically coupled to maid retaining assembly, said retaining assembly allowing motion of said probe carrier along said sliding couplings;
   a probe mounted on said probe carrier; bearing pads connected to said probe carrier; and
   a wafer chuck in slidable contact with said bearing pads,
   wherein said bearing pads maintain relative positioning of said probe carrier and said wafer chuck and wherein said springs bias said probe carrier toward said wafer chuck to maintain contact between said bearing pads and said wafer chuck when a workpicce is not present.

9. The device of claim 8, further comprising a spray nozzle attached to said probe carrier.

10. The device of claim 9, further comprising a supply hose attached to said probe carrier adapted to supply one of a gas and a liquid to said spray nozzle.

11. The device of claim 8, further comprising supports rods connected between said probe carrier and said bearing pads.

12. The device of claim 8, wherein said probe comprises a multipass optical probe comprising:
   a light source for emitting a light;
   a light collector or detector for receiving said light; and
   a retroreflective element.

13. The device of claim 8, wherein said probe comprises one of an inductive coupling measurement probe and a capacitive coupling measurement probe.

14. The device of claim 8, further comprising a process controller connected to said probe and being adapted to provide film thickness measurement of a workpiece attached to said chuck.

15. A chemical-mechanical polishing (CMP) apparatus having a rinse tank, said rinse tank comprising:
   a probe;
   bearing pads operatively connected to a probe carrier;
   a wafer chuck in contact with said bearing pads when a workpiece is not present;
   a biasing member adapted to compel said probe toward said wafer chuck, wherein said bearing pads maintain relative positioning of said probe carrier and said wafer chuck;
   spray nozzles positioned within said rinse tank and being adapted to clean the workpiece mounted on said wafer chuck; and
   a process controller operatively connected to said probe and being adapted to measure a thickness of a portion of said workpiece.

16. The CMP apparatus in claim 15, further comprising a probe carrier for supporting said probe and said spray nozzles, said biasing member being connected to said probe carrier.

17. The CMP rinse tank in claim 16, further comprising:
   a retaining assembly connected to said probe carrier, said retaining assembly including said biasing member and sliding couplings; and
   a support ring connected to said retaining assembly,
   wherein said probe carrier is mechanically coupled to said retaining assembly, said retaining assembly allowing motion of said probe carrier along said sliding couplings.

18. The device of claim 16, further comprising supports rods connected between said probe carrier and said bearing pads.

19. The device of claim 15, further comprising a supply hose attached to said spray nozzles adapted to supply one of a gas and a liquid to said spray nozzles.

20. The device of claim 15, wherein said probe comprises a multipass optical probe comprising:
   a light source for emitting a light;
   a light collector or detector for receiving said light; and
   a retroreflective element.

* * * * *